US010289175B2

(12) United States Patent
Malgaud et al.

(10) Patent No.: US 10,289,175 B2
(45) Date of Patent: May 14, 2019

(54) ACTIVE THERMOELECTRIC COOLING PAD WITH INFRARED THERMAL SENSOR (71) Applicant: Line Holding Limited, Hong Kong (HK)

(72) Inventors: Quentin Malgaud, Villers-la-Ville (BE); Nancy de Fays, Woluwe-Saint-Pierre (BE)

(73) Assignee: Line Holding Limited, Hong Kong (HK)

( * ) Notice: Subject to any disclaimer, the term of this patent is extended or adjusted under 35 U.S.C. 154(b) by 0 days.

(21) Appl. No.: 15/724,762

(22) Filed: Oct. 4, 2017

(65) Prior Publication Data

US 2018/0101203 A1 Apr. 12, 2018

Related U.S. Application Data (60) Provisional application No. 62/405,182, filed on Oct. 6, 2016.

(51) Int. Cl.
*G06F 1/20* (2006.01)
*H05K 7/20* (2006.01)
*G05D 23/27* (2006.01)
*H01L 23/34* (2006.01)
*H01L 23/427* (2006.01)
*H01L 23/467* (2006.01)
(Continued)

(52) U.S. Cl.
CPC .............. *G06F 1/203* (2013.01); *G05D 23/27* (2013.01); *H01L 23/34* (2013.01); *H01L 23/427* (2013.01); *H01L 23/467* (2013.01); *H05K 7/20136* (2013.01); *G01J 5/0003* (2013.01); *H01L 23/3672* (2013.01)

(58) Field of Classification Search
CPC ............................ G06F 1/203; H05K 7/20136; H05K 7/20145; H05K 7/20154; H05K 7/20209; G01J 5/0003; G05D 23/27; H01L 23/34; H01L 23/3672; H01L 23/427; H01L 23/467
USPC ........................................ 361/679.47–679.52
See application file for complete search history.

(56) References Cited

U.S. PATENT DOCUMENTS 4,738,113 A * 4/1988 Rudick ................... F25B 21/02
62/3.5
4,930,317 A * 6/1990 Klein ........................ A61F 7/00
62/259.3
(Continued)

FOREIGN PATENT DOCUMENTS

KR 20020070208 A * 9/2002

OTHER PUBLICATIONS

Google translation of Ryu KR 20020070208 A.*

*Primary Examiner* — Jacob R Crum
(74) *Attorney, Agent, or Firm* — Sideman & Bancroft LLP;; Guy W. Chambers (57) ABSTRACT A cooling pad to dissipate heat from a portable computing system. The cooling pad of the present invention includes a fan, heat sink and thermal sensor inside the cooling pad housing. When the cooling pad heat sink is placed next to the portable computing system and its thermal sensor detects a portable computing system temperature above a pre-determined threshold, the fan in the cooling pad can turn on to dissipate heat from the cooling pad's heat sink and thereby also dissipate heat from the portable computing system.

8 Claims, 13 Drawing Sheets

(51) Int. Cl.
*G01J 5/00* (2006.01)
*H01L 23/367* (2006.01)

(56) References Cited

U.S. PATENT DOCUMENTS

| | | | |
|---|---|---|---|
| 8,270,168 B2* | 9/2012 | Lin | G06F 1/1632 |
| | | | 165/185 |
| 8,705,233 B2* | 4/2014 | Rehmann | G06F 1/203 |
| | | | 361/679.49 |
| 2003/0058615 A1* | 3/2003 | Becker | G06F 1/1632 |
| | | | 361/679.48 |
| 2004/0228085 A1* | 11/2004 | Chen | G06F 1/203 |
| | | | 361/679.47 |
| 2005/0287685 A1* | 12/2005 | McFadden | G01R 31/2874 |
| | | | 438/17 |
| 2013/0114205 A1* | 5/2013 | Huang | G06F 1/1632 |
| | | | 361/679.49 |
| 2017/0049004 A1* | 2/2017 | Tsai | H02J 7/0042 |
| 2017/0168531 A1* | 6/2017 | Casparian | G06F 1/206 |

* cited by examiner

ACTIVE THERMOELECTRIC COOLING PAD WITH INFRARED THERMAL SENSOR

CROSS-REFERENCE TO RELATED APPLICATIONS

This application claims priority under 35 U.S.C. § 119(e) to U.S. Provisional Application No. 62/405,182, filed Oct. 6, 2016, entitled "Active Thermoelectric Cooling Pad," which is incorporated by reference in its entirety for all purposes.

FIELD OF THE INVENTION

The present invention relates to heat dissipation, particularly a cooling pad designed to be placed underneath a computing system such as a tablet, notebook, laptop and other computing system, to dissipate the heat generated by such computing system.

BACKGROUND OF THE INVENTION

Computing systems such as laptops, tablets and notebooks produce heat by converting electricity to computing power. Manufacturers have long addressed such heat by connecting heat sinks to the hottest components, including CPU and GPU. Those heat sinks are placed in front of fans that extract heat by blowing air into the opposite side of the heat sink. Hot air is usually driven directly out of the computing system enclosure afterwards.

Historically, the majority of computing systems would have an air intake located on the bottom surface. Since the arrival of aluminum cased laptops and tablets, air intake has moved to other places such as keyboard and external ports on the side. The bottom of those aluminum cased computing systems then serves as passive cooling, dissipating heat on the entire surface.

Regardless of the air intake position, computing system cooling has always been a challenge in terms of efficiency, power consumption, noise, and space.

Over the years, media content have become heavier and software programs have become more complex to process. This created the need for more powerful CPU and GPU engines.

Key components (such as CPU, GPU or SOC) of computing systems should always remain below 200° F. Fans and embedded cooling system should be dimensioned accordingly.

Due to the reliance upon batteries in portable computing systems, power consumption is a critical matter. Cooling systems have improved over the years to consume as little power as possible.

Many improvements have also been made to reduce the noise generated by the cooling on laptops and computers in general. These improvements have been made for productivity and comfort reasons amongst others.

Like other components in computing systems, cooling components have drastically decreased in size during the past couple of years. These reductions in computing components sizes were aimed at improving portability and mobility for users.

Due to recent competition on thinness, some laptops are now passively cooled. The heat sink is directly connected to the aluminum enclosure, which acts as the only source of heat dissipation.

This trend towards portability makes it more difficult to accommodate more powerful components. Indeed, more powerful components typically require even more robust cooling systems. As a result, laptops, ultrabooks, and other computing systems have a tendency to overheat during peak usage.

BRIEF SUMMARY OF THE INVENTION

The present invention is directed to a cooling pad for use with computing systems. The cooling pad of the present invention is different from other cooling pads by the nature of the cooling system. Instead of blowing air at room temperature towards the bottom of the computing system, the present invention monitors the temperature of the computing system and actively reduces the temperature of the computing system through the top surface of the cooling pad.

The temperature of the upper surface of the cooling pad is reduced using thermoelectric technology. The electric power needed for the cooling pad is delivered by an internal battery, or directly from a female USB type-C port. An electronic thermal sensor monitors the temperature of the computing system placed on top of the cooling pad. The cooling technology of the present invention is activated when the electronic thermal sensor detects that the computing system has reached a pre-determined threshold temperature. Thermoelectric technology then starts transferring heat from the top plate of the cooling pad to the heat sink. The heat sink presents one flat side aimed at collecting heat from a hot source on the computing system and a radiator to dissipate it. A thermal sensor placed on the heat sink monitors its temperature. When the temperature of the heat sink reaches a pre-determined temperature, such as 85° F. or 100° F., the flat fan of the cooling pad is powered up to blow air at room temperature through the heat sink radiator.

By being placed on a cooling pad surface at lower temperature, a computing system is cooled down. In the case of an aluminum enclosed computing system, the bottom of the computing system case dissipates heat faster if placed close to or directly on top of a cooling pad surface of a significantly lower temperature. In the case of a regular plastic cased computing system with air intake on the bottom part, the air sucked inside the case would first flow along a cooling pad surface at significantly lower temperature. Such intake air would then be cooler than if the computing system was to be placed on a room temperature surface. In the process, the internal cooling system of the computing system would in turn be more efficient.

The present cooling technology is encapsulated inside a housing made out of thermal conductor material, such as aluminum. Such housing is preferably perforated to allow air flow. The fact that the fan is placed inside a semi-closed environment allows for significant noise reduction compared to regular cooling pads.

The entire cooling pad system including the fan, the thermoelectric plates and both thermal sensors is powered by either a dedicated battery or via a USB port connected to the computing system.

DETAILED DESCRIPTION OF THE INVENTION

Figure 1:
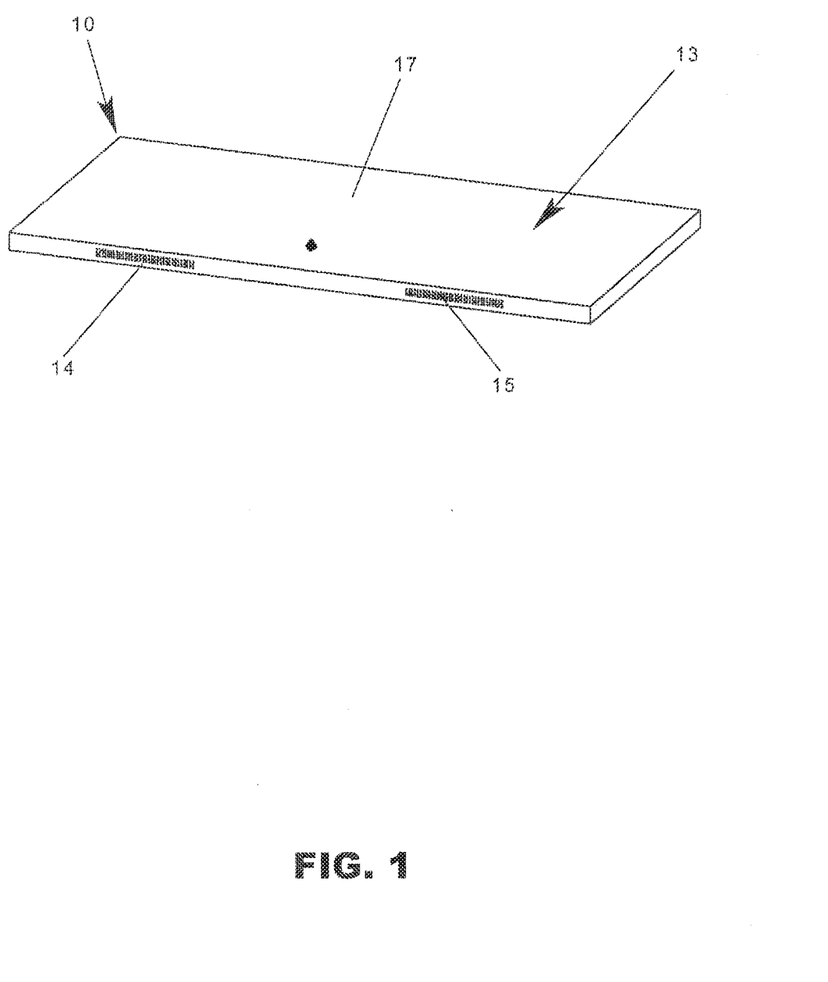
FIG. 1 shows a top perspective view of the body of a preferred cooling pad of this invention.

FIG. 1 illustrates a preferred cooling pad 10 of the present invention as it would be viewed from the outside and rear. This cooling pad 10 has an exterior housing 13 of which upper surface 17 is composed of thermo conductive material, such as aluminum. The cooling pad 10 has two openings on its backside, one for air intake 14 and one for air exhaust 15. The cooling system of the cooling pad uses thermoelectric plates to cool the upper side 17 to a temperature significantly lower than room temperature.

Figure 2:
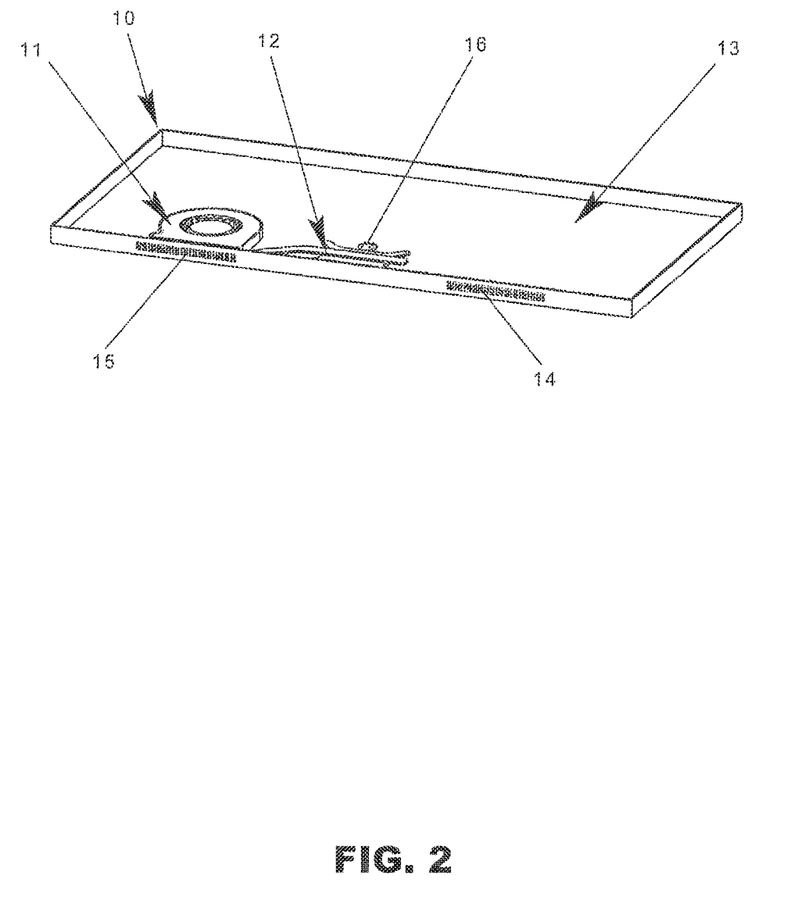
FIG. 2 shows a bottom perspective view of the inside of a preferred cooling pad of this invention.

FIG. 2 shows this inside of the cooling pad 10 positioned upside down. The housing 13 is cut open in order to show the inner components forming the core cooling technology. Powered by either a battery or a USB type-C port, a flat fan 11 blows air from the inside of the housing through the air exhaust hole 15. The air intake 14 lets air flow inside the housing. A heat sink 12 is placed above one or more thermoelectric plates. An infrared thermal sensor 16 is facing toward the upper side of the housing. As FIG. 2 shows the cooling pad 10 positioned upside down, the infrared temperature sensor 16 is shown facing downward. A preferred infrared thermal sensor is made by Melexis, with reference MLX90614.

Figure 3:
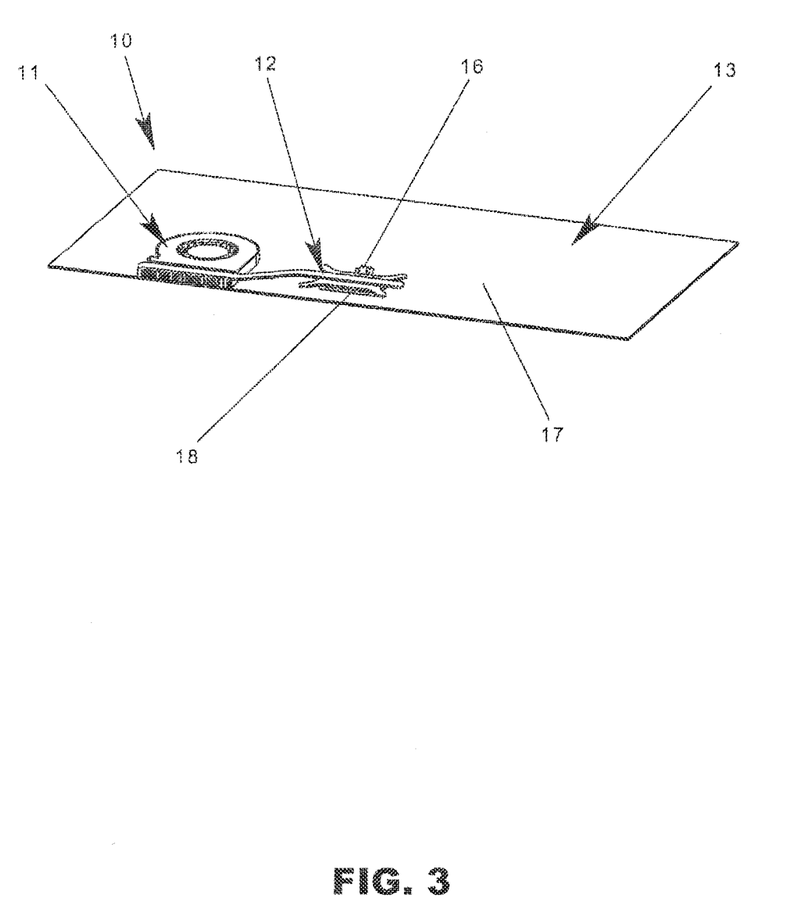
FIG. 3 shows a bottom perspective view of the inside of a preferred cooling pad of this invention without the sides of the case.

FIG. 3 illustrates the inside of the cooling pad 10 where the housing 13 is cut open, showing only its upper side 17, made out of thermo conductive material, such as aluminum. The flat fan 11 is glued directly on the upper side 17 of the housing 13. One or more thermoelectric plates 18 are placed directly against the upper side 17 of the housing 13. Thermal conductivity is ensured by thermal paste. A thermoelectric plate 18 is a solid-state active heat pump which transfers heat from one side of the device to the other. The other side of the thermoelectric plate 18 is covered by a heat sink 12. Next to the thermoelectric plate 18 is an infrared thermal sensor 16 facing towards the upper side 17 of the housing 13.

Figure 4:
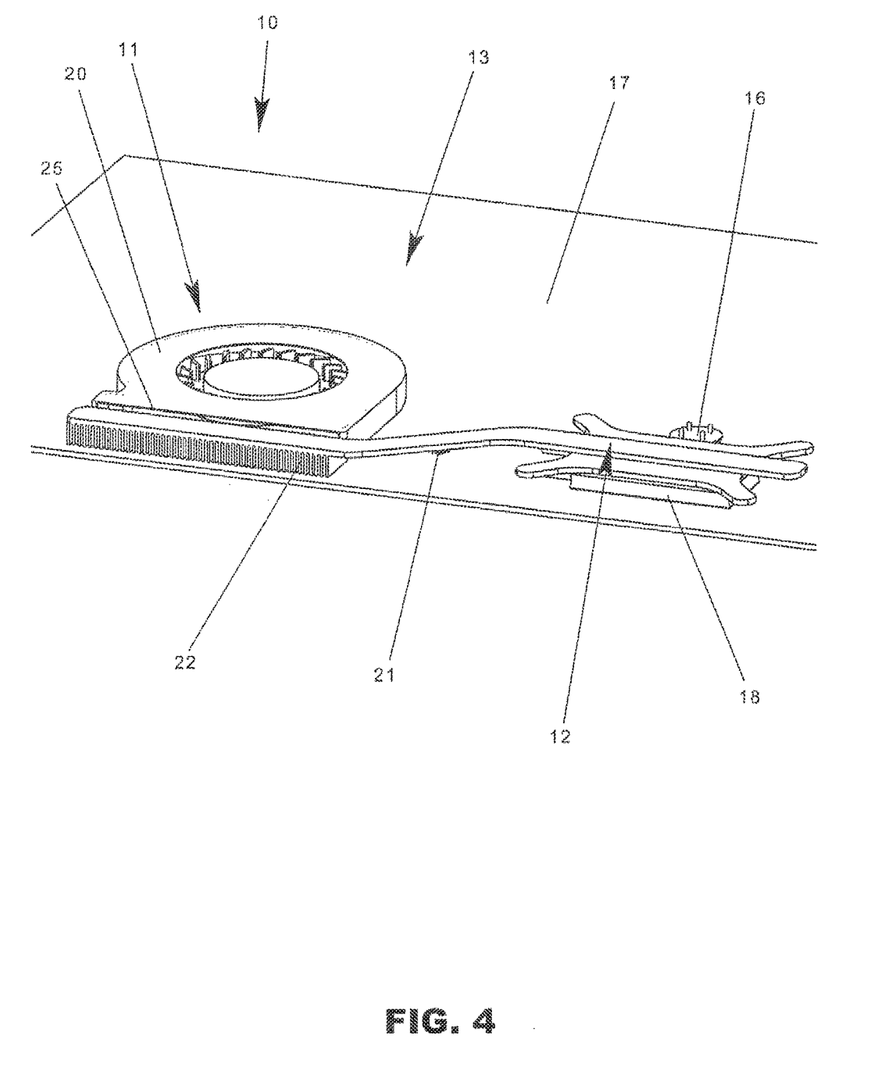
FIG. 4 shows a bottom perspective close up view of the core cooling technology inside the cooling pad.

FIG. 4 represents a close up view of the cooling pad 10 components of the present invention. In this view, the cooling pad 10 is positioned upside down and the housing 13 is cut open. Only the upper side 17 of the housing 13 is visible. One or more thermoelectric plates 18 are placed directly against the upper side 17 of the housing 13. One side of the heat sink 12 holds the thermoelectric plate 18 in place. The other side of the heat sink 12 presents a radiator 22 in which the flat fan 11 blows air at room temperature. The thermoelectric plates 18 are flat and parallel-piped with less than 4 millimeters height. Its upper and lower surfaces have a square or rectangular section of equal dimensions. When powered on via either the internal battery or the USB type-C port, heat is transferred from the upper side of the thermoelectric plate 18 facing the upper side 17 of the housing 13, to the bottom side of the thermoelectric plate, while thermally connected to the heat sink 12. A thermal sensor 21 is placed directly on the heat sink 12 to monitor its temperature.

Figure 5:
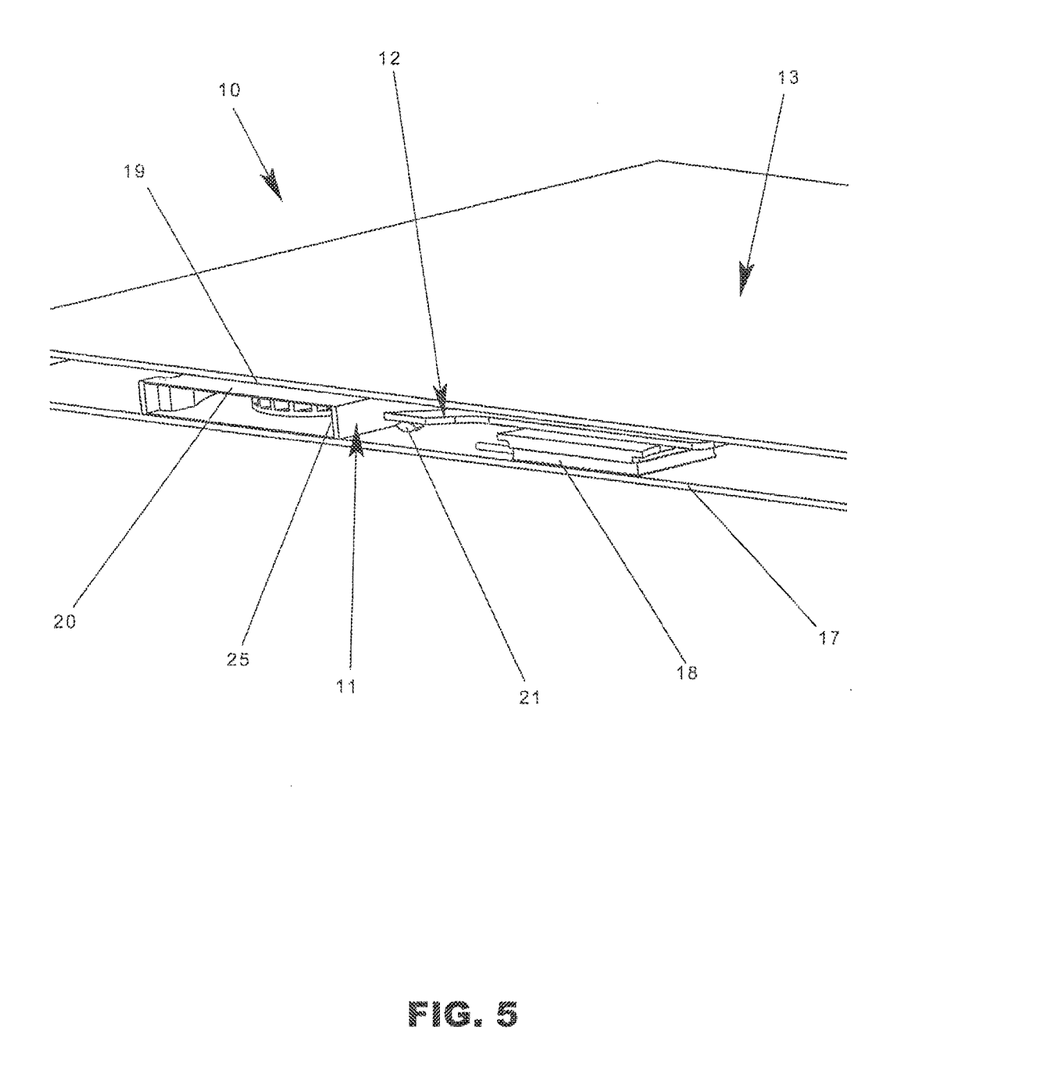
FIG. 5 is a cut-away view of the cooling technology embedded in the case.

FIG. 5 is a close up view of a preferred cooling pad 10 of this invention cut open vertically, and placed upside down. The back panel of the housing 13 has been cut out to reveal the cooling system of the present invention. A flat fan 11 is placed upside down in the cooling pad. The bottom of the fan 11 is glued to the upper side 17 of the housing 13. The air exhaust 25 of the fan faces the air exhaust 15 of the housing 13 described in FIG. 1. Air exhaust 15 of the housing 13 is cut out in the present view. The top side 20 of the flat fan 11 is facing the bottom side 19 of the housing 13. As the air intake of the fan 11 is on its top side 20, with a minimum space between the top side 20 of the fan 11 and the bottom side 19 of the housing 13. A thermoelectric plate 18 is held in place against the inner surface of the top side 17 of the housing 13 by a heat sink 12. A temperature sensor 21 is placed directly on the heat sink 12 to monitor its temperature. The preferred temperature sensor 21 is a temperature compensation type NTC made by Measurement Specialties, with reference 44014 RC.

Figure 6:
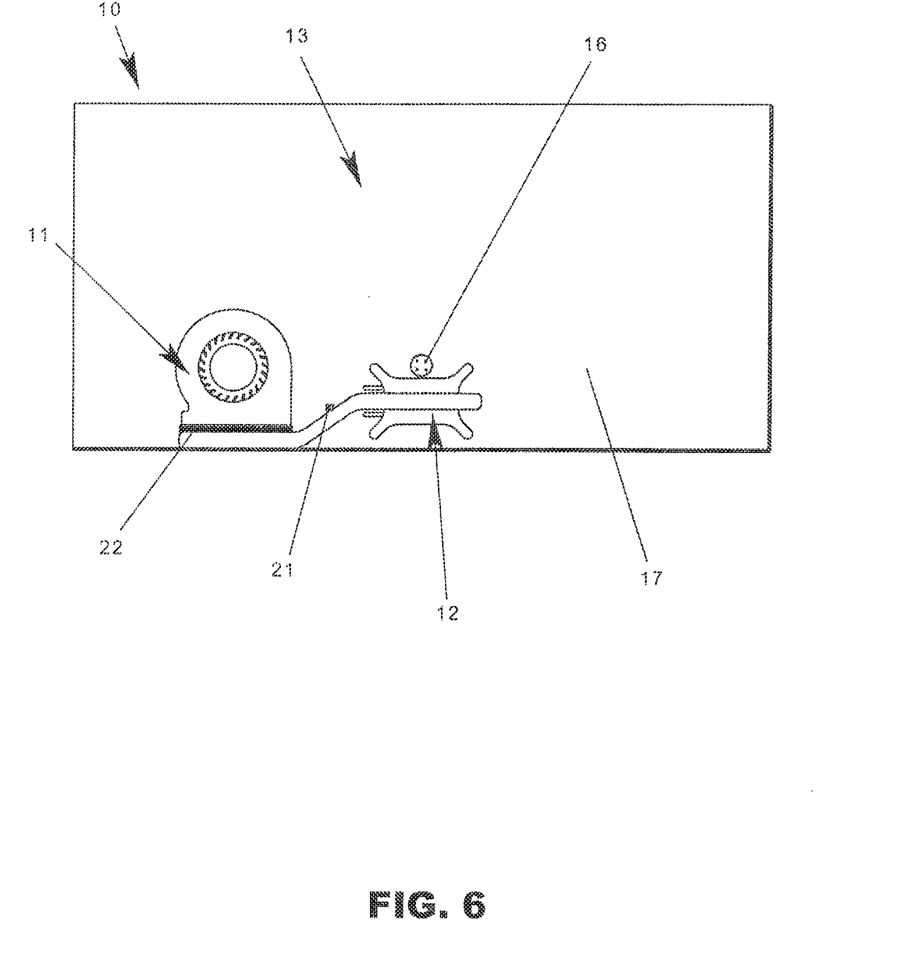
FIG. 6 is a bottom view of the inside of a preferred cooling pad illustrating the disposition of all components.

FIG. 6 shows a bottom, cut-away view of the preferred cooling pad 10. Only the upper side 17 of the housing 13 is visible as other sides are cut out. An infrared thermal sensor 16 is facing towards the upper side 17 next to the heat sink 12. A temperature sensor 21 is placed on the heat sink 12. A flat fan 11 blows air in the radiator 22 at the end of the heat sink 12 to dissipate the heat. The flat fan 11 is powered via either a battery or a USB type-C port.

Figure 7:
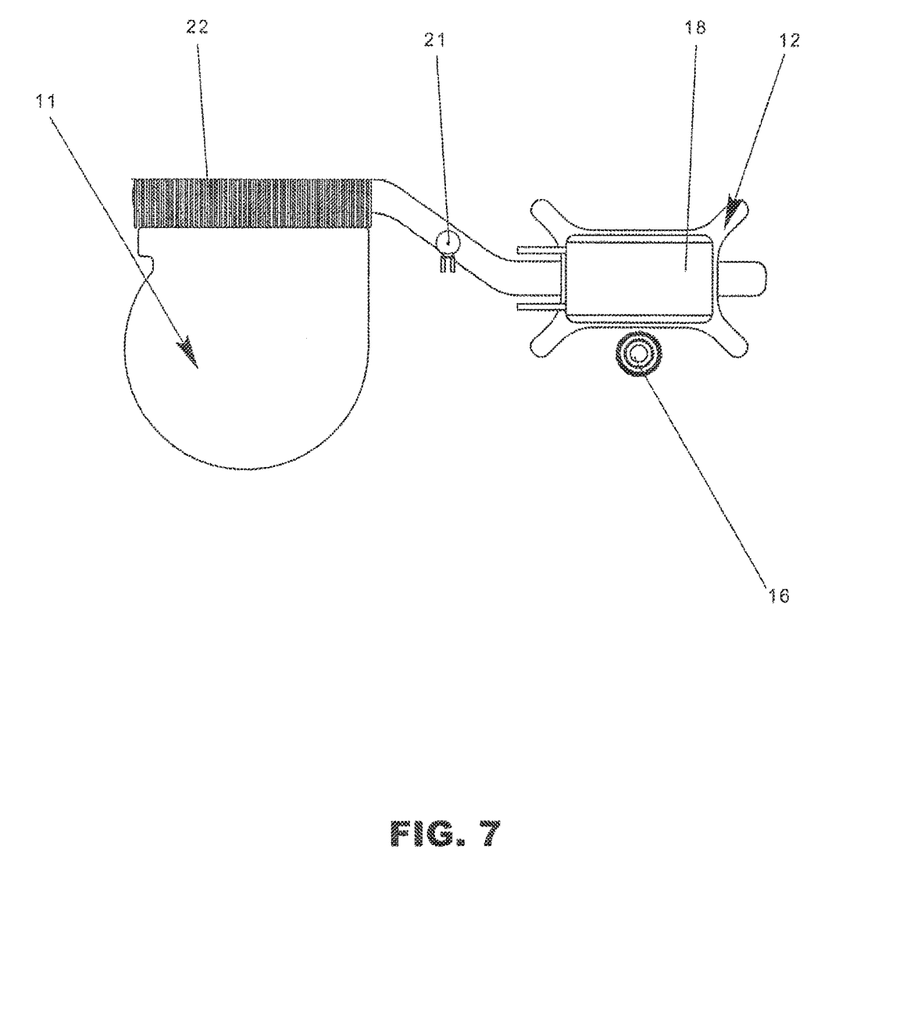
FIG. 7 is a top view of the cooling components.

FIG. 7 illustrates the cooling technology of the preferred cooling pad of this invention without the housing 13. The main component is the heat sink 12 ended by a radiator 22. In front of the radiator 22 is a flat fan 11. In the middle of the heat sink 12 is a temperature sensor 21. A thermoelectric plate 18 is placed against the heat sink 12. Next to the thermoelectric plate 18 is an infrared thermal sensor 16.

Figure 8:
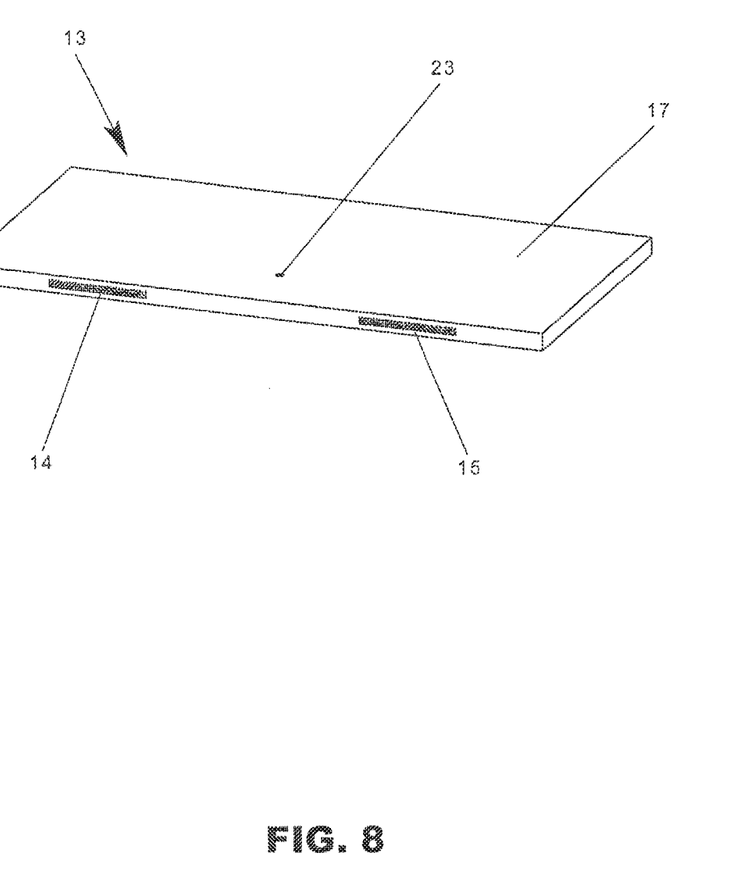
FIG. 8 shows a top perspective view of the cooling pad housing.

FIG. 8 is a perspective view of the housing 13. The upper side 17 is made out of thermo conductive material in order for the thermoelectric plate 18 to transfer heat from it to the heat sink 12. The backside of the housing 13 presents two openings for the air intake 14 and the air exhaust 15 allowing air flow into the housing 13 otherwise closed. There is a hole 23 in the upper side 17 of the housing 13. The hole 23 allows the infrared thermal sensor 16 described in FIG. 6 and positioned right in front of it to monitor the temperature of the computing system placed on the cooling pad 10.

Figure 9:
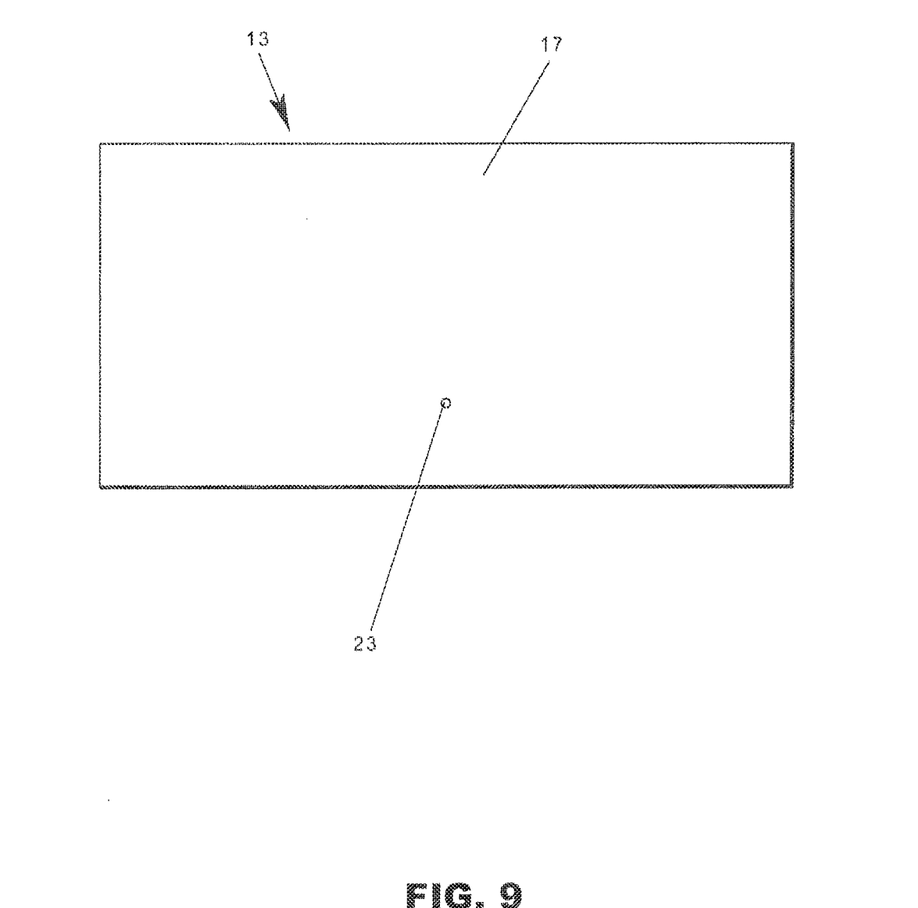
FIG. 9 shows a top view of the cooling pad housing.

FIG. 9 is a top view of the housing 13 of the preferred cooling pad 10 of the present invention. The hole 23 is horizontally centered and offset vertically on the upper side 17 of the housing 13. This allows the infrared thermal sensor 16 of FIG. 6 to monitor the bottom of the computing system placed on the preferred cooling pad where the average thermal signature is the highest.

Figure 10:
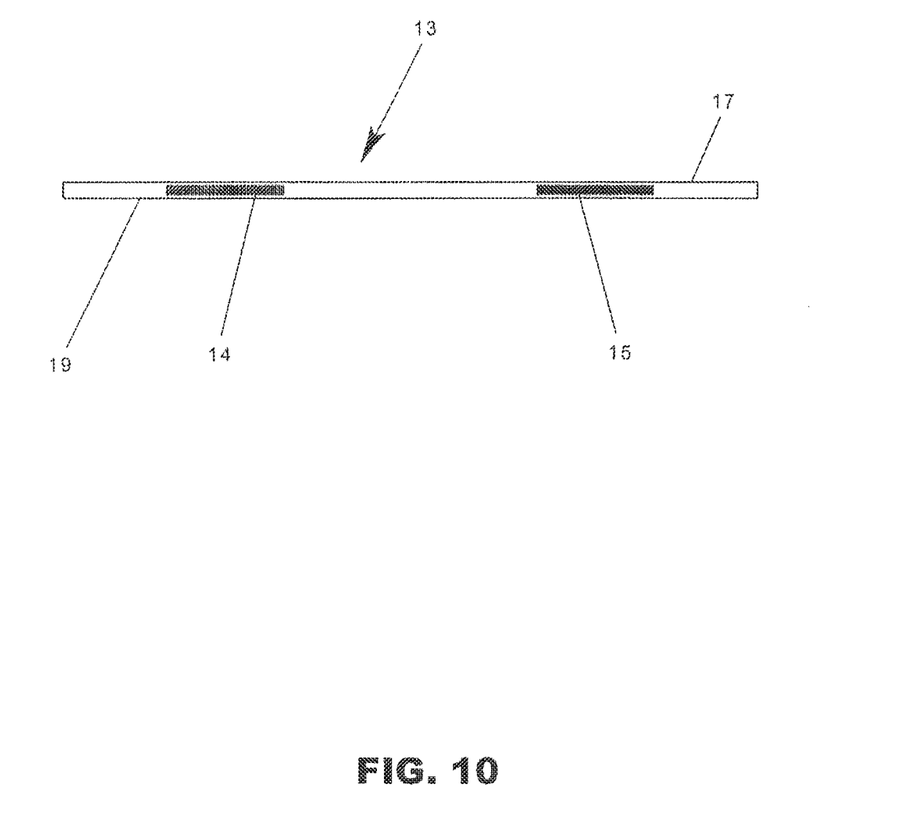
FIG. 10 shows a front view of the cooling pad housing.

FIG. 10 shows a front view of the backside of the housing 13 of the cooling pad 10. The air intake 14 and the air exhaust 15 are on the same side. The computing system is placed on the upper side 17 and the bottom side 19 that supports the cooling pad.

Figure 11:
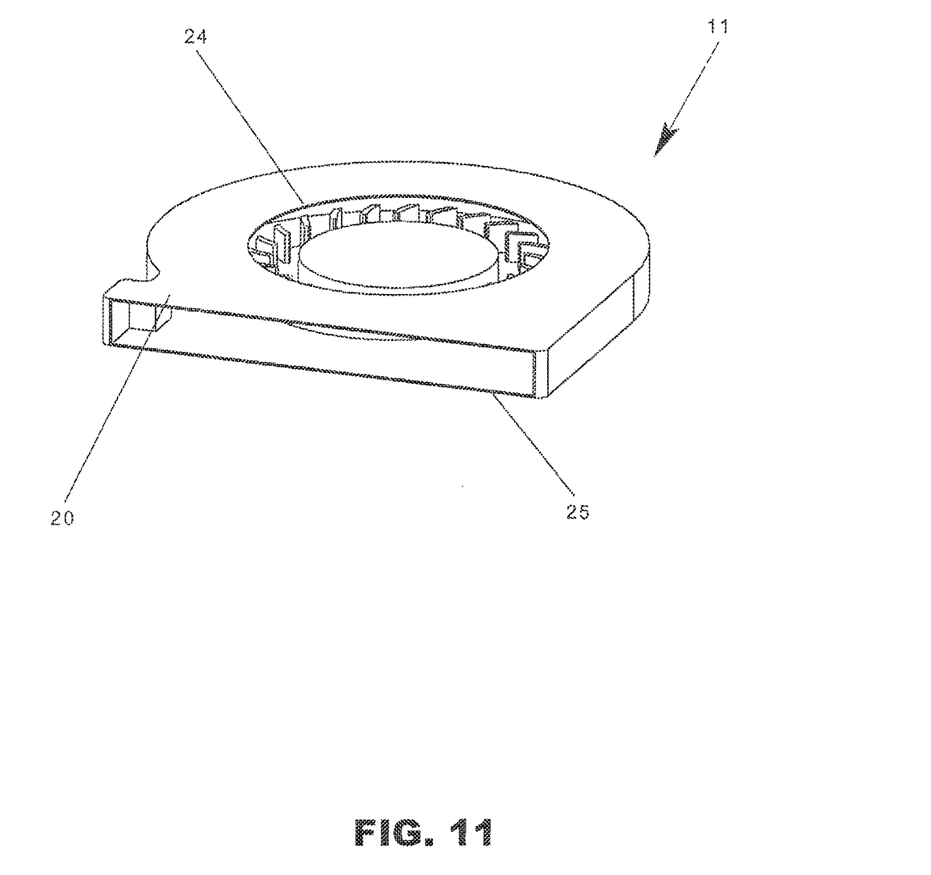
FIG. 11 shows a perspective view of a typical fan used in the present invention.

FIG. 11 illustrates a typical flat fan 11 used in the preferred cooling pad 10. The preferred manufacturer is Sunon. The flat fan 11 is compact, silent and efficient. The air intake 24 of the flat fan 11 is on the upper side and the air exhaust 25 is on one of the lateral sides. Air intake 24 and exhaust 25 are perpendicular. The air exhaust 25 is placed right in front of the radiator 22 of the heat sink 12 as shown in FIG. 4. The preferred minimum distance between air intake 24 and the opposite side 19 of the housing 13 is 1.5 millimeters.

Figure 12:
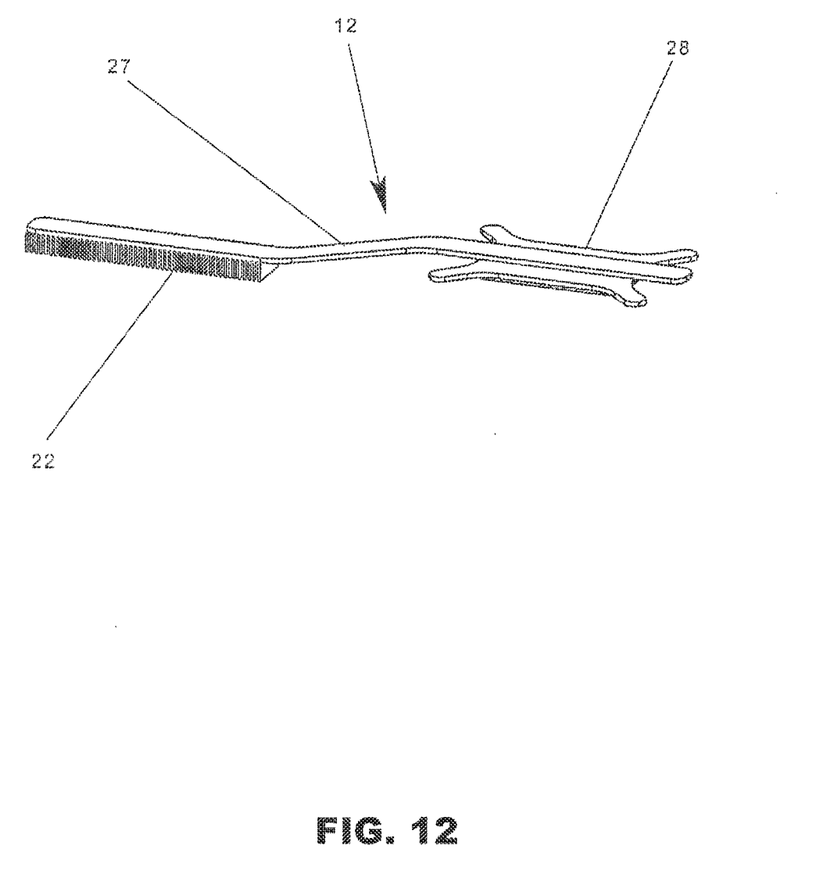
FIG. 12 is a perspective view of a typical heat sink used in the present invention.

FIG. 12 shows a perspective view of a typical heat sink 12 used in the preferred cooling pad 10. Such heat sink is usually found in laptop computers as part of the cooling system. The thermal conductive pipe 27 is the central piece of the heat sink 12 that transfers heat from the collective plate 28 to the radiator 22.

Figure 13:
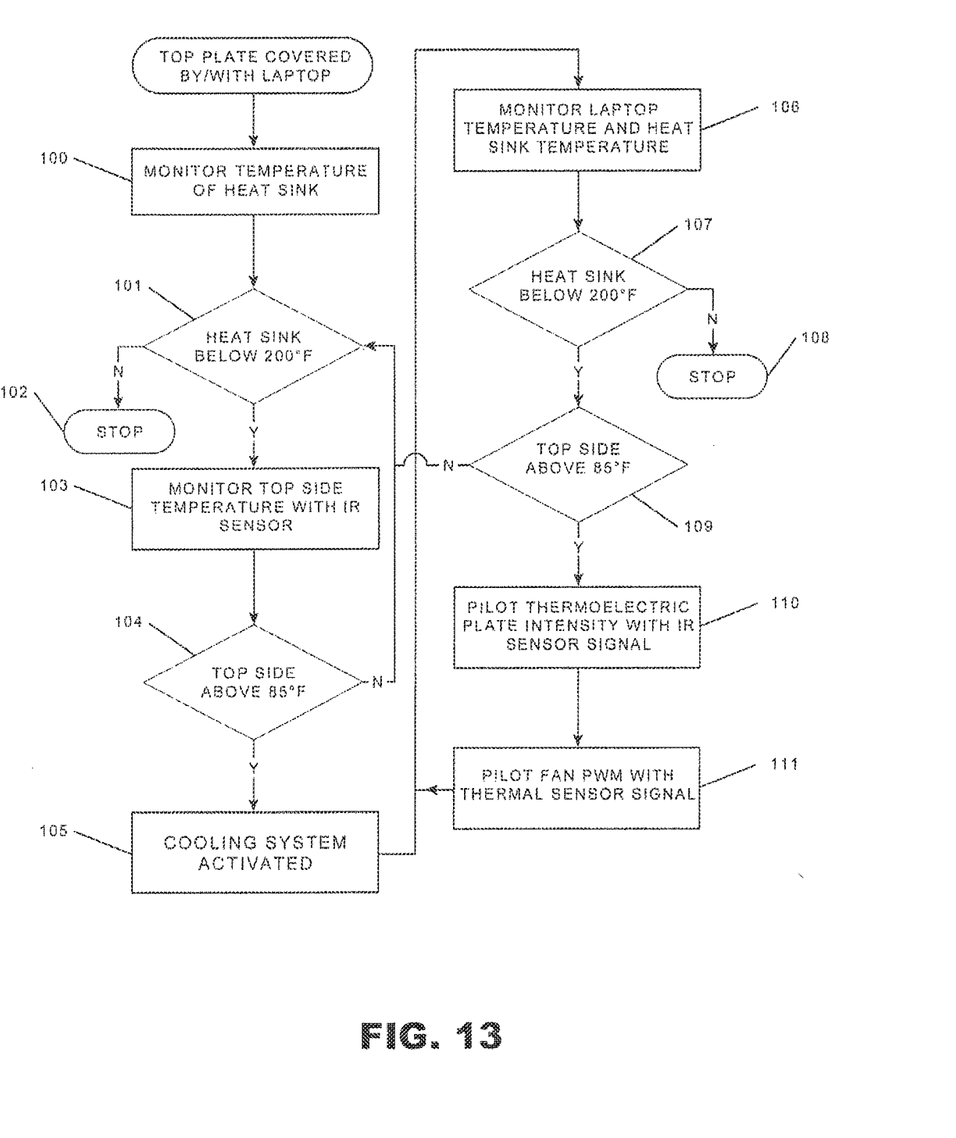
FIG. 13 is a logic flow chart illustrating the steps from the microcontroller's perspective to activate the cooling system.

FIG. 13 summarizes the cooling process of the present invention from the perspective of the cooling pad 10 and, particularly, its microcontroller. Before the cooling process is initiated, the microcontroller monitors the temperature 100 of the heat sink 12 via a thermal sensor 21 that is placed on the cooling pad for this specific purpose. If the heat sink is already at its maximum temperature of 200° F. or above, the cooling pad shuts down for safety reasons 102. If the temperature is below 200° F., the microcontroller monitors 103 the temperature of the computing system placed on the cooling pad 10 via the infrared thermal sensor 16. If the computing system temperature is below 85° F., the cooling system is not activated and the microcontroller loops through those two checks. If the temperature sensed by the infrared thermal sensor 16 is above 85° F., the cooling system is activated and the thermoelectric plate is triggered 105.

When the cooling system is activated, the microcontroller monitors 106 the temperature of the computing system via the infrared sensor 16 and the temperature of the heat sink via a thermal sensor 21. The cooling system increases or decreases the intensity of the current flowing into the thermoelectric plate 18 proportionally to the temperature of the computing system 110, and pilots the Pulse-Width Modulation 111 of the flat fan 11 with inverse proportionally to the temperature of the heat sink 12. This loops keeps running as long as the temperature of the computing system is above 85° F. and the temperature of the heat sink is below 200° F. If the temperature of the computing system falls below 85° F., the system goes back to step 101. If the temperature of the heat sink 12 reaches 200° F. or above, the cooling system shuts down for safety reasons 108.

What is claimed is:

1. A thermoelectric cooling pad to cool a computing system comprising:
    a housing with a surface plate of thermo conductive material;
    a flat, electrically powered fan inside said housing;
    a thermoelectric plate;
    a heat sink inside said housing connected to said fan and said thermoelectric plate;
    an infrared thermal sensor inside said housing; and,
    a hole in said surface plate between said infrared thermal sensor and said computing system, wherein said infrared thermal sensor is capable of directly sensing a temperature of a bottom surface of said computing system through said hole;
    wherein said fan is activated whenever said surface plate of said cooling pad is placed next to said computing system and said infrared thermal sensor senses heat above a pre-determined threshold temperature emanating from said computing system.

2. The cooling pad of claim 1 wherein said pre-determined threshold temperature is 85° F.

3. The cooling pad of claim 1 wherein infrared thermal sensor points upward toward said hole.

4. The cooling pad of claim 1 wherein said flat fan has an air intake and an exhaust that are parallel to each other.

5. The cooling pad of claim 1 wherein said thermo conductive material is aluminum.

6. The cooling pad of claim 1 wherein said fan is powered by a cooling pad battery or from an external electrical source through a USB connector.

7. The cooling pad of claim 1 further comprising a heat sink temperature sensor.

8. The cooling pad of claim 7 wherein said cooling pad will shut down if said heat sink temperature sensor senses the heat sink having a temperature in excess of 200° F.

\* \* \* \* \*